United States Patent [19]
Yoshimura et al.

[11] Patent Number: 5,467,803
[45] Date of Patent: Nov. 21, 1995

[54] OUTER LEAD BENDING APPARATUS FOR A SEMICONDUCTOR PACKAGE DEVICE HAVING A PACKAGE AND OUTER LEADS EXTENDING FROM THE PACKAGE

[75] Inventors: Atsushi Yoshimura; Hiroshi Shibata, both of Yokohama; Fumio Takahashi, Kitakami; Kuniaki Tsurushima, Atsugi, all of Japan

[73] Assignee: Kabushiki Kaisha Toshiba, Kawasaki, Japan

[21] Appl. No.: 194,506

[22] Filed: Feb. 9, 1994

[30] Foreign Application Priority Data

Feb. 10, 1993 [JP] Japan .................. 5-022275

[51] Int. Cl.⁶ .................................................. B21F 1/00
[52] U.S. Cl. ............................................................ 140/105
[58] Field of Search ...................................... 140/105

[56] References Cited

U.S. PATENT DOCUMENTS 3,796,201 3/1974 Golub ........................................ 140/105
3,903,934 9/1975 Vizy .......................................... 140/105
4,064,917 12/1977 Diaz .......................................... 140/105
4,620,572 11/1986 Baker et al. ............................... 140/105
5,070,916 12/1991 Biesecker ................................. 140/105
5,273,081 12/1993 Maksim ................................... 140/105

FOREIGN PATENT DOCUMENTS

230835 10/1991 Japan ..................................... 140/105

*Primary Examiner*—Lowell A. Larson
*Attorney, Agent, or Firm*—Finnegan, Henderson, Farabow, Garrett & Dunner

[57] ABSTRACT

An outer lead bending apparatus comprises a fixed unit, a movable unit movable toward and away from the fixed unit, a first die detachably mounted on one of the fixed unit and movable unit and holding a semiconductor package devise in place, and a second die detachably mounted on the other unit and, when the movable unit is driven toward the fixed unit, bending, together with the first die, the outer leads of the semiconductor package devise into a given configuration.

10 Claims, 6 Drawing Sheets

OUTER LEAD BENDING APPARATUS FOR A SEMICONDUCTOR PACKAGE DEVICE HAVING A PACKAGE AND OUTER LEADS EXTENDING FROM THE PACKAGE

BACKGROUND OF THE INVENTION

1. Field of the Invention

The present invention relates to an outer lead bending apparatus for a semiconductor package device which can bend the outer leads extending from a package of the semiconductor package device into a particular configuration and to an apparatus for bending the outer leads of a surface-mount semiconductor package device in particular.

2. Description of the Related Art

A so-called surface-mount semiconductor package device is manufactured by molding a semiconductor element set on a lead frame to provide a package with the semiconductor element covered and bending the outer leads outwardly extending from the package into a predetermined configuration.

For a QFP (quad flat package) with outer leads extending in four directions (X and Y directions), for example, the outer lead bending process is carried out as follows.

That is, the outer lead bending process comprises the vertical bending step of vertically bending all the outer leads extending horizontally in X and Y directions, the X-direction horizontal bending step of horizontally bending the forward end portions of the outer leads extending in the X direction, the Y direction horizontal bending step of bending the forward end portions of the outer leads extending in the Y direction and cutting step of cutting the bent forward end portions of the outer leads to a given length.

The conventional outer lead bending apparatus used to horizontally bend the outer leads in the X and Y directions has the following tasks to be solved.

First, the outer lead bending apparatus has no general-purpose application and products obtained become expensive.

That is, the conventional outer lead bending apparatus for bending the outer leads of the semiconductor package has no general-purpose application and it is necessary that it be used in a one-apparatus-per-product basis.

For the manufacture of semiconductor package devices of various sizes and shapes, therefore, corresponding devices need to be newly designed and manufactured.

Recently the semiconductor package devices have been a tendency to be manufactured on a many-product small-quantity basis. Under this situation, more outer lead bending apparatuses have to be manufactured, thus presenting an equipment investment problem.

Second, the positioning of the upper and lower dies is difficult to achieve.

That is, in order to facilitate the loading and unloading of the semiconductor package device between the upper die and the lower die, the upper die is supported by guide posts mounted upright in a cantilever fashion on one widith-direction side of the lower die, so that the upper die can be moved freely in an up/down direction.

In such an arrangement, a place where the outer leads of the package device are actually bent in the horizontal direction is located remote from the guide posts and, further, the tilting of the guide posts occurs. With a lapse of time, the accuracy with which the upper and lower dies are positioned is lowered due to such tilting of the guide post, thus adversely affecting the quality of products obtained.

Recently, more outer leads are provided in more narrow pitch on the semiconductor package device and higher accuracy is highly demanded in bending the outer leads of the package device. It is, therefore, necessary to position the upper and lower dies accurately and stably.

SUMMARY OF THE INVENTION

It is accordingly the object of the present invention to provide an outer lead bending apparatus for a semiconductor package device having a package and outer leads extending from the package which can accurately bend the outer leads of the semiconductor package device and has a high general-purpose application.

According to the present invention, there is provided an outer lead bending apparatus for a semiconductor package device having a package and outer leads extending from the package, that comprises first and second holding units, wherein one of the holding units is driven in a driving direction toward and away from the other unit. A first die unit is detachably secured to the first holding unit and has a first holding section for holding a semiconductor package device; the first die unit also defining a space around the first holding section where outer leads of the semiconductor package device are inserted. A moving body is slidably movable in this defined space in a direction perpendicular to the driving direction to an extent corresponding to a bending length of the outer leads to bend the outer lead portions in a direction substantially perpendicular to the driving direction.

The bending assembly further comprises a second die unit detachably secured to the second holding unit and having a second holding section holding the semiconductor package device relative to the first holding section. A restricting section of the second die unit projects from a surrounding area of the second holding section for holding the outer leads relative to the moving body and restricts the bending direction of the outer leads.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

One embodiment of the present invention will be explained below with reference to the accompanying drawings.

As shown in FIGS. 7A to 7E, an apparatus of the present invention is applied to the step of bending outer leads 2 of a semiconductor package unit 1, such as a QFP (Quad Flat Package), into a predetermined configuration.

Figure 7A:
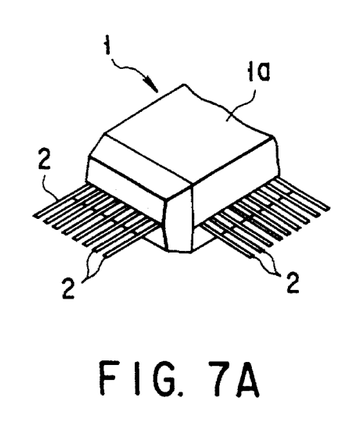
FIG. 7A shows a semiconductor package device and outer leads extending from the device at a start step.

In this step, as shown in FIG. 7A, the outer leads 2 extend substantially horizontally from the side surfaces of the package la and QFP is supported with the outer leads in an unbent state.

Figure 7B:
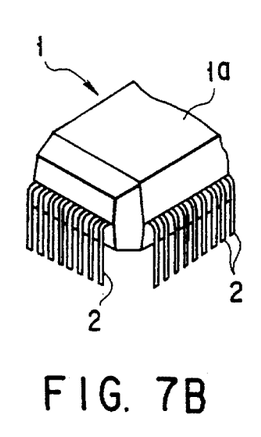
FIG. 7B shows a step of bending the outer leads of the device.

As shown in FIG. 7B, all the outer leads 2 of QFP 1 are once bent downwardly.

Figure 7C:
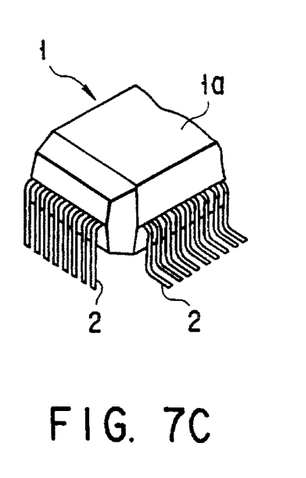
FIG. 7C shows another step of bending the outer leads of the device.
Figure 7D:
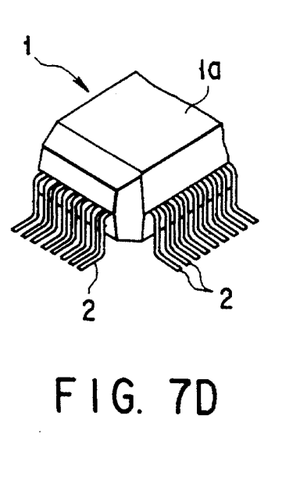
FIG. 7D shows another step of bending the outer leads of the device.

The forward end portions of the outer leads 2 are horizontally bent, for each outer lead array, in an X- and a Y-direction as shown in FIGS. 7C and 7D.

Figure 7E:
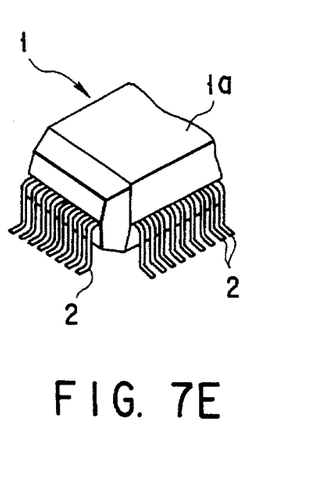
FIG. 7E shows another step of bending the outer leads of the device.

Finally, as shown in FIG. 7E, the tip portions of the outer leads 2 are cut to a predetermined length. The resultant outer leads 2 are formed as external terminals of QFP 1.

The bending apparatus of the present invention is of such a type that, of the bending steps of the outer leads as set out above, it makes bends as shown in FIGS. 7C and 7D, that is, bends the forward portions of the once downwardly bent outer leads 2 horizontally in the X and Y directions.

Now the arrangement of the bending apparatus according to the present invention will be explained below. It is to be noted that the bending apparatus for bending the outer leads 2 in the X direction and bending apparatus for bending the outer leads 2 in the Y direction are substantially similar to each other in their arrangement except that their associated dies are different in their directions. Therefore, explanation will be given below about the x-direction bending apparatus and hence the explanation of the Y-direction bending apparatus is omitted.

Figure 1:
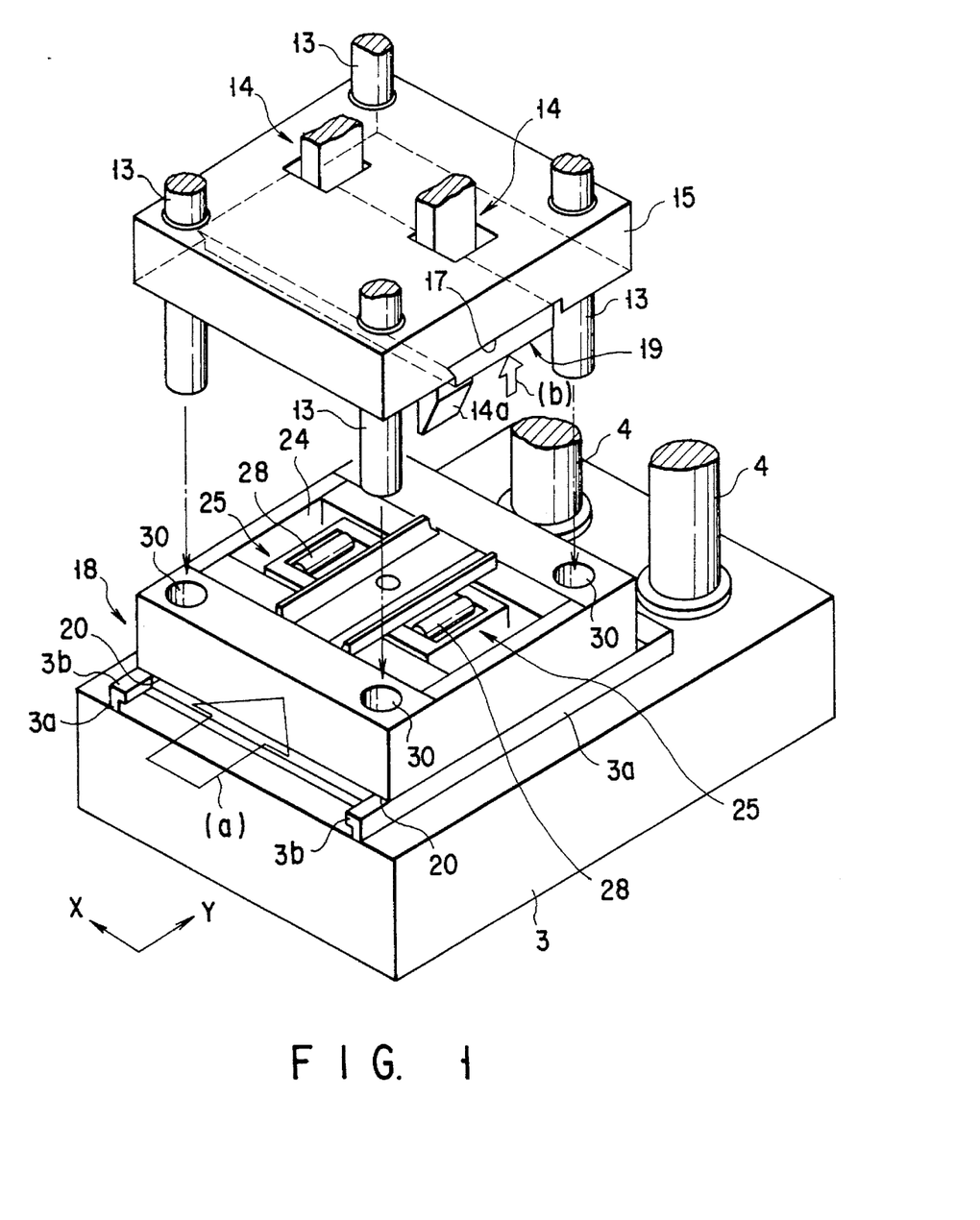
FIG. 1 is an enlarged, perspective view showing a major section of an outer lead bending apparatus according to one embodiment of the present invention.

FIG. 1 is a perspective view showing the X-direction bending apparatus.

In FIG. 1, reference numeral 3 represents a base with a substantially flat upper surface formed thereon. A pair of guides 3a, 3a are provided on the upper surface of the base 3, in a Y direction, in a parallel space-apart relation to hold a lower die 18 as will be set out below. The upper end portions of the paired guides 3a, 3a are so horizontally projected, as projections 3b, 3b, to some extent as to face each other.

A pair of guide posts 4, 4 are provided on the upper surface of the base 3 such that they stand erect at one end portion of the base along a Y direction. As shown in FIG. 2B, a slider 5 is provided partway of each erect guide pole 4 so that it is slidably movable in an up/down direction. A movable assembly as indicated by 6 in FIG. 2B is fixed to the slider 5 with the lower surface of the movable assembly 6 facing the upper surface of the base 3. The movable assembly 6 functions as a first holding assembly.

Figure 2A:
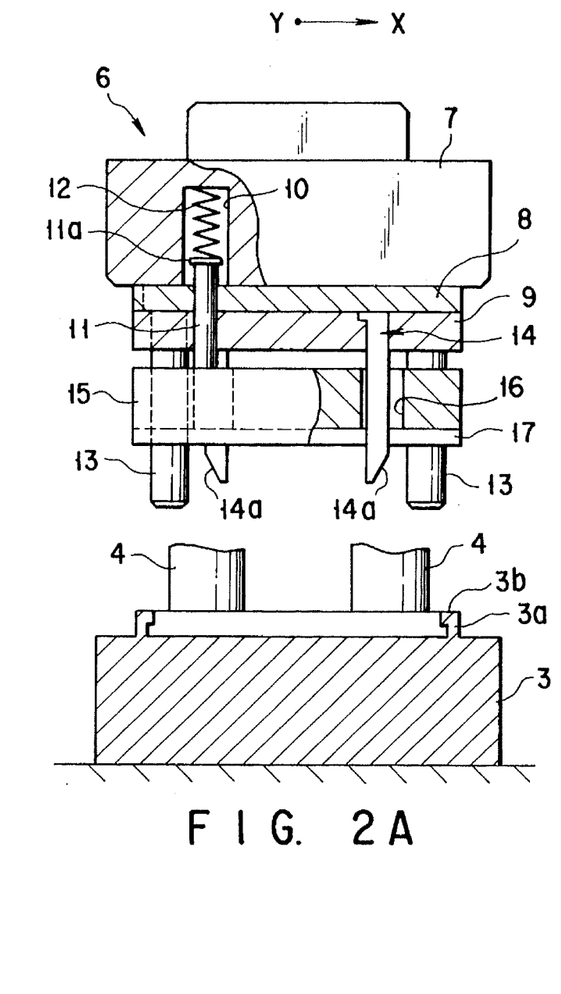
FIG. 2A is a front view showing the apparatus of FIG. 1 with upper and lower dies removed.
Figure 2B:
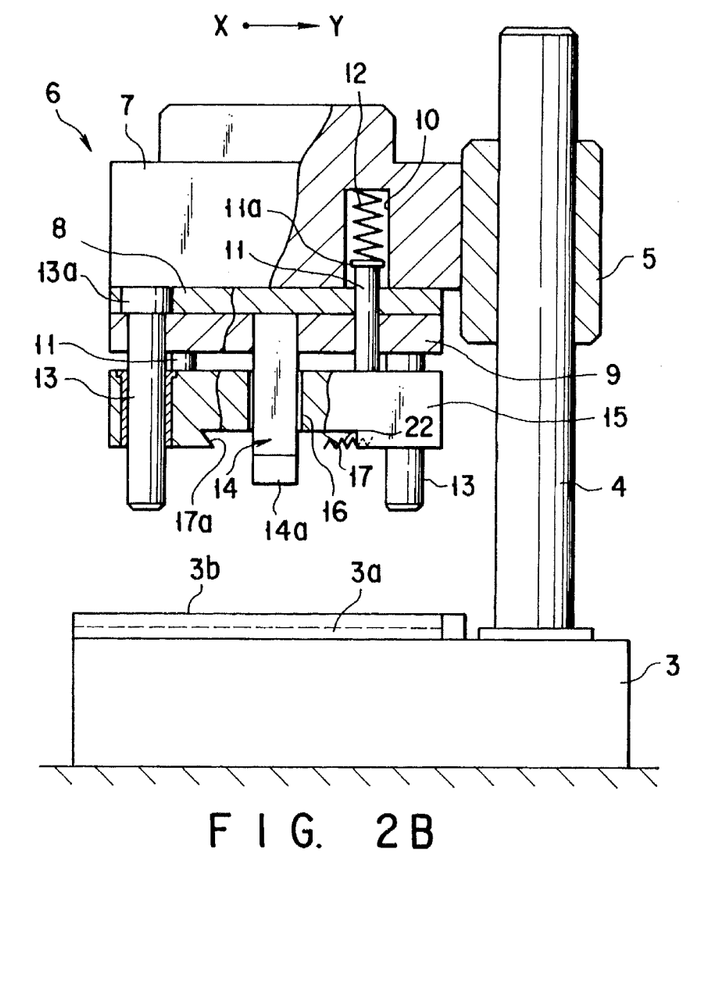
FIG. 2B is a side view showing the apparatus of FIG. 2A.

The movable assembly 6 comprises a body as indicated by 7 in FIG. 2 and first and second holding plates 8 and 9 sequentially attached to the lower surface of the body 7.

A plurality of storage holes 10 though only one is shown in FIG. 2, are provided in the body 7 and opened at the lower surface of the body 7. A push rod 11 has its upper end portions inserted into the storage hole 10 such that its intermediate portion of the push rod 11 is slidably held in the up/down direction.

A flange 11a is provided on the top end of the push rod 11 with a spring 12 provided in a compressed state between the top surface of the flange 11a and the upper wall of the storage hole 10 to downwardly urge the push rod 11.

Positioning posts as indicated by 13 in FIG. 2B are provided one at each of four corners of the first and second holding plates 8 and 9 such that their lower end side is substantially vertically projected from the lower surface of the second holding plate 9.

The top end portion of the positioning post 13 constitutes a flange 13a whose thickness is equal to that of the first holding plate 8. By engaging the flange 13a with the top surface of the second holding plate 9 the positioning post 13 is fixed to the first and second holding plates 8 and 9. A pair of rod-like cams 14, 14 having a tapered cam surface 14a at their lower end portion are vertically fixed to the second holding plate 9 and spaced a predetermined distance away from each other in an X direction such that, as shown in FIG. 2A, the lower end portions of these cams 14 are projected downwardly from the lower surface of the second holding plate 9.

The movable assembly 6 has an upper die holding plate 15 provided partway of the four positioning posts 13 as viewed in their height direction and movable in the up/down direction. The upper die holding plate 15 is arranged with its upper and lower surfaces set in a substantially parallel relation and is slidably mounted on the positioning posts 13 through guide bushes each provided at a corresponding one of the four corner portions of the upper die holding plate 15.

The upper die holding plate 15 is fixed to the lower end face of the push rods 11 by, for example, corresponding bolts not shown and elastically held in an up/down direction by the push rods 11 and springs 12 provided on the upper ends of the push rods 11.

Two through holes 16 are provided in the upper holding plate 15, in the X direction, in a spaced-apart relation to allow the corresponding cams 14 to be inserted. At the middle portion of the lower surface of the upper die holding plate 15, a recess 17 is provided in the X direction across the whole width of the upper die holding plate 15 to hold an upper die 19 as will be set out below.

The side walls of the recess 17 provide upwardly inclined taper surfaces 17a. At one side wall of the recess 17, one-end portions of springs 22 are buried and extend into the recess 17 so as to hold a later-described upper portion of the die.

Figure 5A:
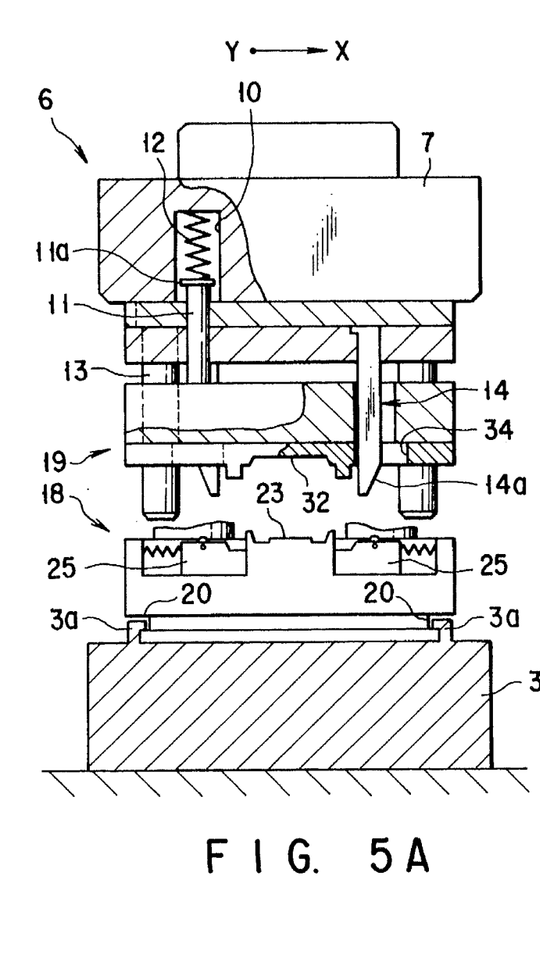
FIG. 5A is a front view, partly taken away, showing the apparatus with the upper and lower dies removed.
Figure 5B:
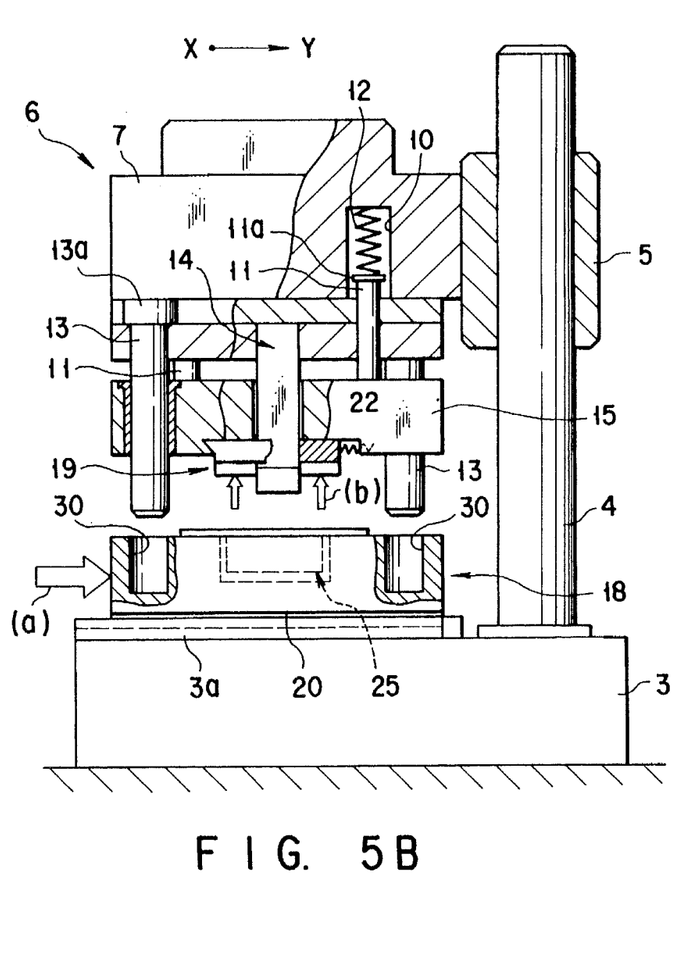
FIG. 5B is side views, partly taken away, showing the apparatus of FIG. 5A.

As shown in FIGS. 1 and 5A and 5B, a lower die (first die) as indicated by 18 and upper die (second die) as indicated by 19 are detachably mounted on the base 3 and movable assembly 6, respectively.

That is, the lower die 18 is detachably mounted in the paired guides 3a provided along the Y direction of the base 3 and the upper die 19 is detachably mounted in the recess 17 provided along the X direction in the upper die holding plate 15 of the movable assembly 6.

Figure 3:
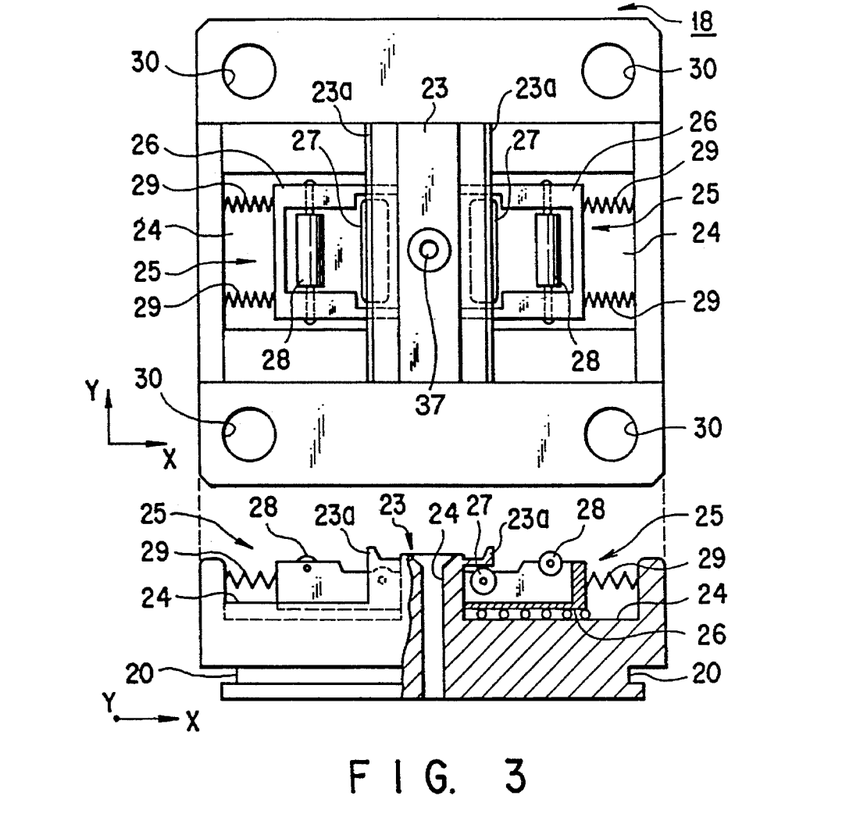
FIG. 3 is a plan view and side view showing a lower die.
Figure 4:
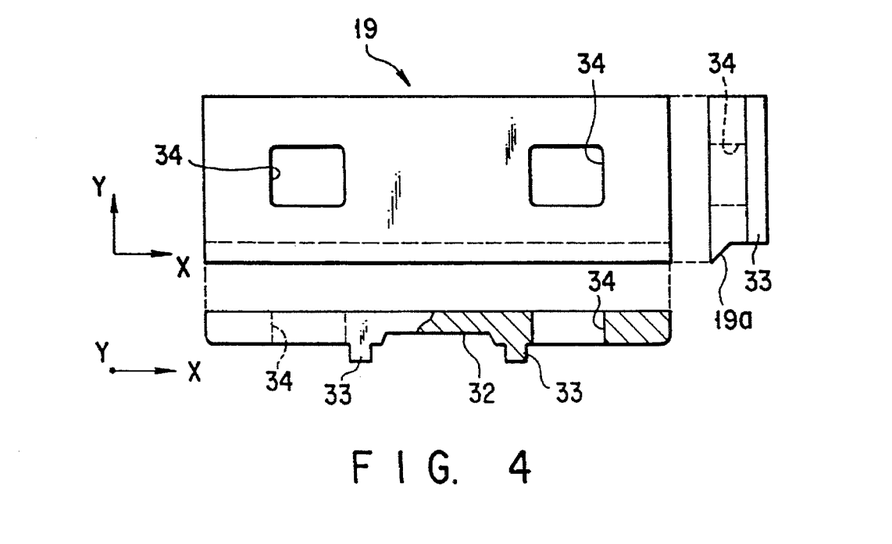
FIG. 4 is a plan view, side view and front view showing an upper die.

The lower die 18 and upper die 19 are adapted to horizontally bend the forward end portions of the outer leads 2 extending in the X direction of QFP 1 and so constructed as shown in FIGS. 3 and 4.

The arrangement of the lower die 18 will be explained below with reference to FIG. 3.

The lower die 18 is formed as a block-like die substantially square in transverse cross-section and has a predetermined height. An engaging groove 20 is provided in the whole peripheral edge portion and at the lower end portion of the side surface of the lower die 18 and engages with the projection 3b of the guide 3a provided on the base 3.

A holding section 23 is provided at the middle portions of the upper surface of the lower die 18 to hold the lower surface of the package 1a of QFP 1. The holding section 23 has substantially flat upper surface and a suction hole 37 is opened at that area where QFP 1 is held and is connected by a vacuum means not shown. Thus the lower die 18 holds QFP 1 in place, under a suction force, on the upper surface of the holding section 23 (see FIGS. 6A and 6B).

Figure 6A:
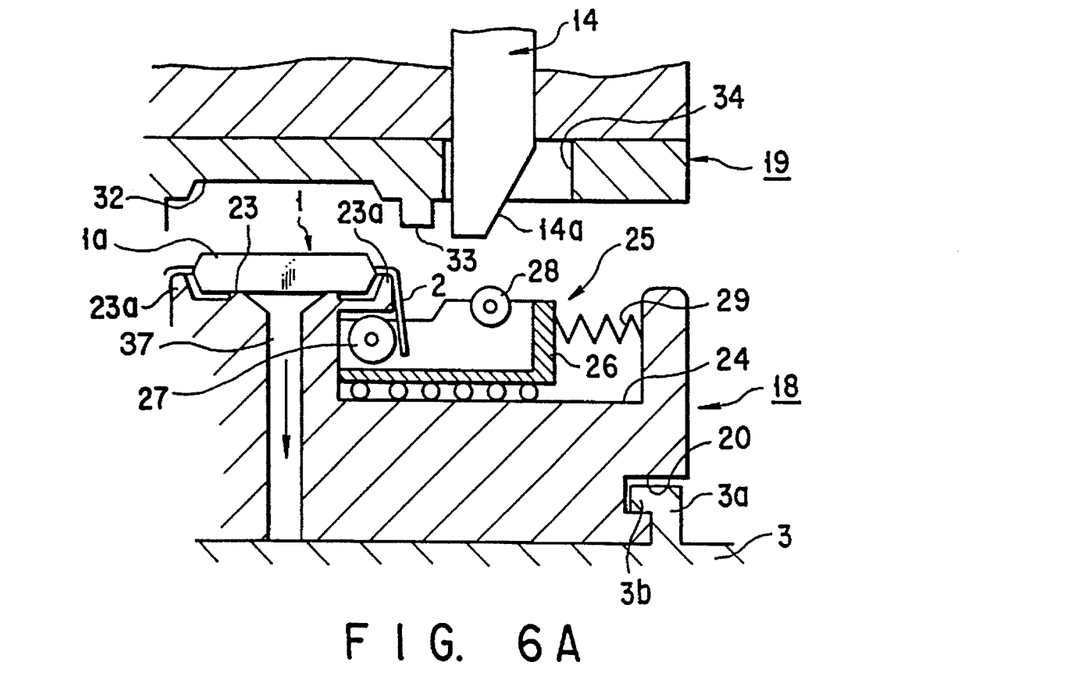
FIG. 6A shows a process of bending outer leads of a semiconductor package device on the apparatus.
Figure 6B:
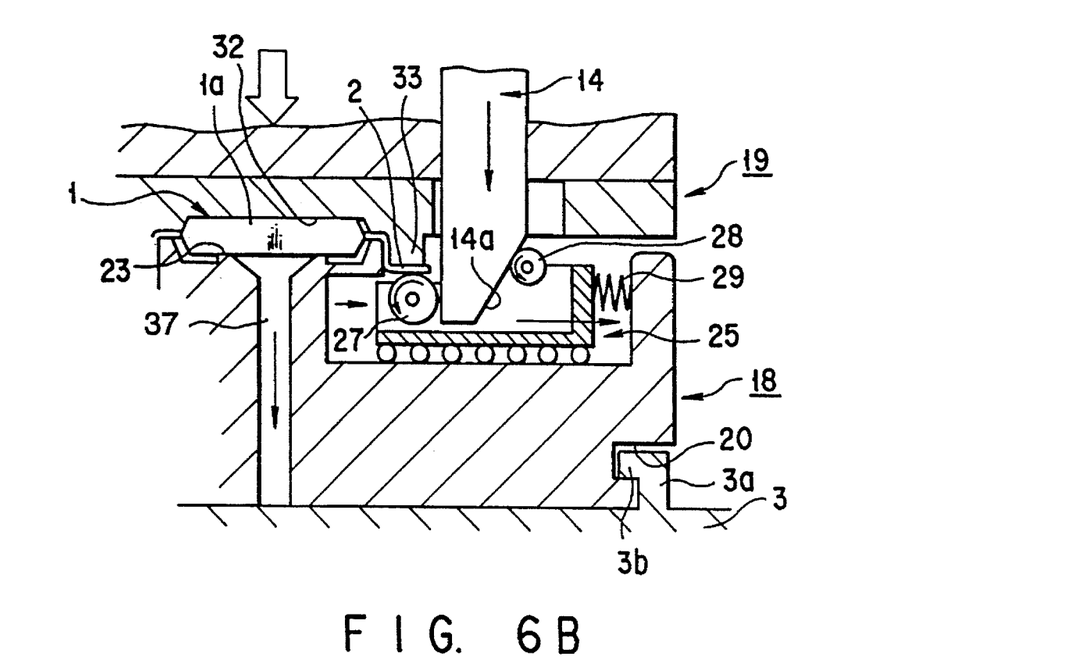
FIG. 6B shows the process of bending the leads of the semiconductor package device on the apparatus.

Holding areas 23a are provided on both opposed ends of the holding section 23 as viewed in the X direction and holds the base end portions of the outer leads 2 in place as shown in FIG. 6 which have their one-end portions bent from a state extending from QFP 1 in the X direction as shown in FIG. 7B.

As shown in FIGS. 1 and 3, a space 24 of a given depth is provided at each X-direction side of the lower die 18 with the holding section 23 in between. A moving body 25 is held in the space 24 and adapted to be cam driven, by the cam 14, outwardly in the X direction and to horizontally bend the outer leads 2 of QFP 1.

The moving body 25 has a frame 26 held in the space 24 so as to be movable in the X direction, rollers 27 rotatable in its Y-direction axis on the holding section 23 side above the frame 26 and moving in the X direction so that the roller 27 is abutted against the lower surfaces of the outer leads 2 and bends them, and cam followers 28 provided outwardly in the X-direction of the frame 26 and driven by the cam face 14a of the cam 14 so that the moving body 25 is moved outwardly in the X direction.

The roller 27 has its surface, for example, specially treated, such as fluorine-treated, so as to prevent a solder, etc., deposited on the outer leads 2 from being detached therefrom.

Between an X-direction outer end face of the moving body 25 and an inner wall surface of the space 24 opposed to the outer end face of the moving body 25, springs 29 are inserted in a compressed state so that the moving body 25 is urged toward the holding surface 23.

Therefore, the moving body 25 is pushed onto the holding section 23 under the influence of the springs 29 with the outer leads 2 in a pre-processed state and located in the space 24 at a place nearest the holding section 23 as shown in FIG. 6A.

As shown in FIG. 1 four positioning holes 30 are opened at the outer Y-direction upper surface of the lower die 18 with the spaces 24 in between so that the lower end portions of the corresponding positioning posts 13 are inserted there.

The arrangement of the upper die 19 will be explained below with reference to FIG. 4.

The upper die 19 is comprised of a band-like plate whose width is somewhat larger than that of the moving body 25 and, with its longitudinal direction set parallel to the x direction, is inserted into the recess 17 provide in the lower surface of the upper holding plate 15 and fixed there.

A storage section 32 is defined at a central area of the lower surface of the upper die 19 so that QFP 1 is held under a suction on the holding surface 23 of the lower die 18 to hold in place the upper portion of the package 1a of QFP 1 and fix it there.

Projections 33 are provided on the outer side of the storage section 32, that is, on the lower surface of the upper die 19 so as to sandwich the outer leads 2 of QFP 1 relative to the rollers 27 provided at the lower die 18 and to bend the outer leads 2 in a horizontal direction.

Also the projections 33, like the rollers 27, have their surfaces specially treated, such as a fluorine-treated, so as to prevent a solder, etc., deposited on the outer lead 2 from being attached to the projections 33.

An upwardly inclined taper surface 19a is provided on one width-direction side of the upper die 19. Two insertion holes 34, 34 are each provided at each longitudinal end portion of the upper die 19 to allow the corresponding lower end side of the cam 14 to be inserted therethrough.

How to mount the lower and upper dies 18 and 19 is explained below.

The lower die 18 is slidably mounted, in the Y direction, from the other Y-direction end side of the base 3 with its engaging groove 20 engaged with the guide rail 20, as shown in FIGS. 1 and 5B.

The upper die 19 is mounted, from below the upper die holding plate 15, in a holding recess 17 in the lower surface of the upper die holding plate 15, as shown in FIGS. 1, 5A and 5B, while the lower end portion of the cam 14 is being inserted into the through hole 34.

The upper die 19 has its one-side taper surface 19a latched to the taper surface 17a of the recess 17, while being pushed by the springs 22 buried in the recess wall as seen from FIG. 5B, so that the upper die 19 is fixed in place to the recess 17.

Then positioning is performed between the lower die 18 and the upper die 19. First the upper die 19 is displaced in the X direction and positioned in that direction. After this has been done in this position, the upper die 19 is fixed in that position to the upper die holding plate 15 by means of a fixing tool not shown.

Y-direction positioning is carried out by moving the lower die 18 in the Y direction. The moving assembly 6 is downwardly driven while the lower die 18 is put in a freely movable state.

The position of the lower die 18 is adjusted while the positioning posts 13 are inserted into the positioning hole 30 provided at the four corner portions of the lower die 18 (see FIG. 1). After that adjustment has been achieved, the lower die 18 is fixed, in that position, to the base 3 by means of a fixing tool not shown. The positioning of the upper die 19 and lower die 18 is completed by doing so.

The horizontal bending operation of the outer leads 2 of QFP 1 with the use of the present apparatus will be explained below with reference to FIGS. 6A and 6B.

First a QFP 1 is placed on the holding section 23 at the middle portion of the upper surface of the lower die 18 and fixed there under a vacuum suction. At that time, the outer leads 2 of QFP 1 are already vertically bent at a previous step as shown in FIG. 7B. The forward end portions of the outer leads 2 are inserted into the frame 26 of the moving body 25 so that they are located on the outer side of the roller 27.

Then the movable assembly 6 is driven downwardly and, as shown in FIG. 6B, the upper die 19 has its storage section 32 abutted against the upper surface of QFP 1. The upper die 19 pushed QFP 1 and its outer leads 2 toward the lower die 18 by a resilience force of the coil spring 12 through the push rod 11. The package of QFP 1 and the base end portions of its outer leads 2 are fixed between the upper die 19 and the lower die 18.

When the movable assembly 6 is downwardly moved, the cam 14 held by the first and second holding plates 8 and 9 further extends into the space 24 of the lower die 18, as shown in FIG. 6B, with the upper die holding plate 15 stopped, and the inclined cam face 14a of the cam 14 is abutted against the cam follower 28 located at the moving body 25 in the space 24.

With the cam 14 lowered, the cam follower 28 is driven outwardly in the X direction along the inclined cam face 14a and the moving body 25 is driven outwardly in the X direction against a resilience force of the spring 29.

The roller 27 is moved in the X direction, while being rotated in a manner to contact with the lower surfaces of the outer leads 2, to push the outer leads 2 onto the lower surface of the projection 33 provided on the upper die 19 so that the forward end portions of the outer leads 2 are bent in the horizontal direction.

The horizontal bending of the outer leads 2 extending in the x direction of QFP 1 is thus completed.

After the horizontal bending of the leads has thus been completed, QFP 1 is inserted into a Y-direction horizontal bending apparatus having substantially similar in arrangement to the above-mentioned X-direction horizontal bending apparatus. Then the forward end portions of the above-mentioned outer leads 2 are cut to provide completed outer terminals of QFP 1.

The specific arrangement thus explained has the following advantages.

First, the present apparatus has an improved general-purpose application.

That is, in the case where the outer leads 2 of QFPs of different outer dimensions are to be horizontally bent, upper and lower dies 18 and 19 need only to be replaced in accordance with the types of the QFPs, thus providing a greater versatility than in the case where an apparatus including a base 3, etc., is all replaced.

The necessary manufacturing cost of the lower and upper molds 18 and 19 becomes about one half that in newly manufacturing a construction of an apparatus as a whole. It is also possible to largely decrease the period over which the dies are manufactured.

Further, with the above-mentioned X-direction bending apparatus, the engaging groove 20 is provided in the end portion of the lower die 18 over a whole side periphery of the lower die. With the lower die 18 rotated horizontally through an angle of 90° and set on the base 3, it is possible to use the present apparatus as a Y-direction bending apparatus.

In this case, if, in the movable assembly 6, either the first and second holding plates 8 and 9 alone are replaced or the first and second holding plates 8 and 9 are 90° rotated in the horizontal direction and the body 7 is mounted there, the present apparatus can be employed as the Y-direction bending apparatus with the other arrangement intact and, therefore, the versatility of the apparatus has further improved.

Second, it is possible to achieve the readiness with which the upper and lower dies 19 and 18 are exchanged for new ones. That is, the lower die 18 can be slidably attached to, and detached from, the base 3. Further, the upper die 19 can be mounted in place simply by inserting the upper die 19 from below into the recess 17 of the upper holding plate 15.

Since, by so doing, it is easy to attach and detach the upper die 19 and lower die 18, the operability of the present apparatus can be improved at a setup time.

Thirdly, the positioning of the upper die 19 and lower die 18 can be achieved simply and accurately.

That is, since the lower die 18 and upper die 19 can be adjusted in the Y direction and X direction, respectively, after these lower and upper dies 18 and 19 have been mounted on the base 3 and upper die holding plate 15, it is possible to locates these dies accurately in the Y and X directions.

At the positioning time of the lower die 18 the four guide posts 13 of the movable assembly 6 are inserted into the insertion holes 30 of the lower die 18 whereby it is possible to position the lower die 18. The upper and lower dies 19 and 18 can be positioned simply and accurately.

Further, the upper die 19 and lower die 18 can be positioned with high accuracy.

In the outer lead bending apparatus, QFP 1 is readily loaded into, and unloaded from, the dies and the movable assembly 6 is held by the guide posts 4 in a cantilever fashion whereby, without providing any hindrance, QFP 1 is loaded into, and unloaded from, the dies on a side opposite to that on which the guide posts 4 are disposed.

There was the case where a positional displacement occurred, with time, between an upper die and a lower die due to the tilting of the guide posts resulting from a variation in surrounding circumstances and conditions of loading on a movable assembly 6. Further, there was the case where the positional accuracy of the upper die and lower die was deviated due to a guiding section side being located remote from a point of processing.

According to the present invention, however, the positioning posts 13 are inserted into the positioning holes 30 of the lower die 18 according to which a positional alignment can be achieved near to a point of processing, a point which is different from that of the conventional processing. It is, therefore, possible to prevent the tilting of the guide post 4. Further, high precision processing can be achieved and maintained according to the present invention.

The present invention is not restricted to the above-mentioned embodiment and can be variously changed or modified without departing from the spirit and scope of the present invention.

Although, in the above-mentioned embodiment, the outer leads 2 of QFP 1 are bent by locating a movable unit, including the movable assembly and upper die 19, in an upper position and moving it downwardly, the same processing can also be made by locating the movable unit in a lower position and moving it upwardly.

The configuration of the cam 14 is not restricted to that of the above-mentioned embodiment. Although, in the above-mentioned embodiment, the cam face 14a of the cam 14 is inclined, instead the drive roller may be provided at the lower end of the cam 14 to allow it to be abutted against the cam follower 28 so that the cam follower 28 is driven by the drive roller. It may also possible to bend the outer leads 2 of QFP 1 directly by the lower end of the cam 14.

The cam follower 28 provided on the moving body 25 is not restricted to the configuration of the roller. For the inclined cam face 14a of the cam 14, a corresponding inclined cam face may be provided so that it cam be abutted against the inclined cam face 14a of the cam 14.

Although, in the above-mentioned embodiment, QFP 1 has outer leads 2 extending in four directions, the present invention is not restricted thereto. An SOP (small outline package) outer leads can be bent according to the present invention in which case the outer leads of SOP extend in two directions.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An outer lead bending apparatus for a semiconductor package device having a package and outer leads extending from the package, comprising:

first and second holding units, wherein one of the holding units is driven in a driving direction toward and away from the other unit;

a first die unit detachably secured to the first holding unit and having a first holding section for holding a semiconductor package device, the first die unit defining a space around the first holding section where outer leads of the semiconductor package device are inserted, and a moving body slidably movable in the space in a direction perpendicular to the driving direction to an extent corresponding to a bending length of the outer leads to bend the outer lead portions in a direction substantially perpendicular to the driving direction; and a second die unit detachably secured to the second holding unit and having a second holding section holding the semiconductor package device relative to the first holding section and a restricting section projecting from a surrounding area of the second holding section for holding the outer leads relative to the moving body and restricting the bending direction of the outer leads.

2. The outer lead bending apparatus according to claim 1, wherein the first and second die units are mounted on the first and second holding units in a plane perpendicular to the driving direction of the first and second holding units and in a manner to enable their mount positions to be adjusted in these directions perpendicular to each other.

3. The outer lead bending apparatus according to claim 1, wherein the first die unit has a suction hole, opened at the holding section of the first die unit, for holding the package of the semiconductor package device in place under a suction force.

4. The outer lead bending apparatus according to claim 1, wherein the moving body has a roller holding the outer leads of the semiconductor package device relative to the restricting section of the second die unit and adapted to be rotated in contact with the outer leads of the semiconductor package device to bend the outer leads in the direction in which the moving body is moved.

5. The outer lead bending apparatus according to claim 1, wherein the moving body is urged in a direction opposite to that in which the moving body is moved.

6. The outer lead bending apparatus according to claim 1, further comprising drive means in the second die unit for driving the moving body in a direction away from the first holding section when one of the first and second holding units is driven toward the other holding unit.

7. The outer lead bending apparatus according to claim 6, wherein the drive means includes a cam having a base end fixed to said second holding unit and a forward end portion receivable in a corresponding space in the first die unit supported by the first holding unit to drive the moving body in a direction away from the holding section of the first die unit when one of the first and second holding units is driven toward the other holding unit.

8. The outer lead bending apparatus according to claim 7, wherein the moving body has a corresponding cam follower with which the cam is contacted.

9. The outer lead bending apparatus according to claim 1, further comprising:

a guide post projecting from one of the first and second holding units and holding the other holding unit such that said other holding unit is movable in the driving direction; and a positioning guide post projecting from the second holding unit holding the second die unit and, when the first and second holding units are driven toward each other, engaging with the first die unit to position the first and second die units relative to each other.

10. The outer lead bending apparatus according to claim 1, further comprising:

a guide post projecting from one of the first and second holding units and holding the other holding unit such that said other holding unit is movable in the driving direction; and at least two positioning guide posts on one of the first and second holding units for positioning the first and second die units relative to each other when the first and second holding units are driven toward each other.

\* \* \* \* \*